United States Patent [19]

Pinneo et al.

[11] Patent Number: 4,939,763

[45] Date of Patent: Jul. 3, 1990

[54] METHOD FOR PREPARING DIAMOND X-RAY TRANSMISSIVE ELEMENTS

[75] Inventors: John M. Pinneo, Woodside; Carey Bailey, Livermore, both of Calif.

[73] Assignee: Crystallume, Menlo Park, Calif.

[21] Appl. No.: 252,804

[22] Filed: Oct. 3, 1988

[51] Int. Cl.$^5$ ............................................. G21K 1/00
[52] U.S. Cl. ...................................... 378/161; 378/35
[58] Field of Search ...................... 378/161, 35; 430/5

[56] References Cited

U.S. PATENT DOCUMENTS

| | | |
|---|---|---|
| 3,030,187 | 4/1962 | Eversole . |
| 3,030,188 | 4/1962 | Eversole . |
| 3,142,539 | 7/1964 | Brinkman . |
| 3,175,885 | 3/1965 | Brinkman . |
| 3,371,996 | 3/1968 | Hibshman . |
| 3,630,678 | 12/1971 | Gardner . |
| 3,630,679 | 12/1971 | Angus . |
| 3,705,937 | 12/1972 | Dzevitsky . |
| 3,714,334 | 1/1973 | Vickery . |
| 4,104,441 | 8/1978 | Fedoseev . |
| 4,178,509 | 12/1979 | More et al. ........................ 378/161 |
| 4,352,787 | 10/1982 | French et al. . |
| 4,436,797 | 3/1984 | Brady et al. ......................... 378/35 |
| 4,608,326 | 8/1986 | Neukermans et al. . |

OTHER PUBLICATIONS

Patel: *Indian Journal of Pure & Applied Physics* "Crystallization of Diamond at Atmospheric Pressure" (vol. 19, 9/81, pp. 803–820).

Burton, *Nature* 8/24/05, p. 397, (No. 1869, vol. 72).

*Primary Examiner*—Carolyn E. Fields
*Assistant Examiner*—David P. Porta
*Attorney, Agent, or Firm*—Flehr, Hohbach, Test, Albritton & Herbert

[57] ABSTRACT

A method is provided for producing thin diamond films which are useful as X-ray transmissive elements.

22 Claims, 1 Drawing Sheet

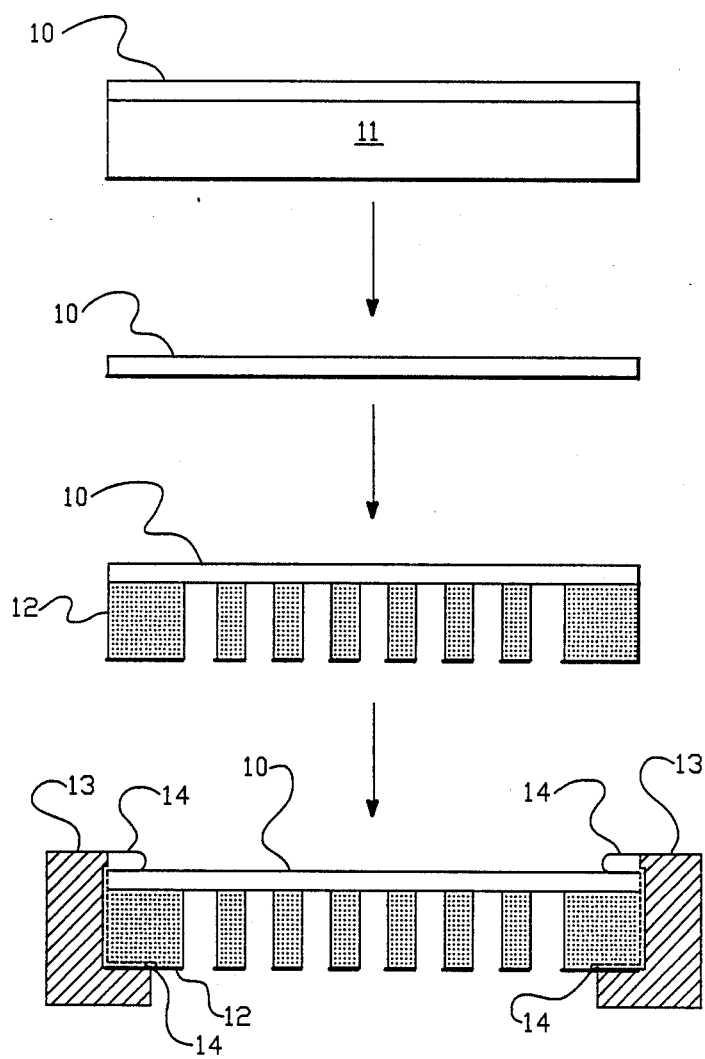

METHOD FOR PREPARING DIAMOND X-RAY TRANSMISSIVE ELEMENTS

The present invention is directed to a method for making synthetic diamond films. In particular, the present invention is directed to making synthetic diamond films which are transmissive to X-ray radiation.

BACKGROUND OF THE INVENTION

Diamond is an allotrope of carbon which is metastable at ordinary pressures, having a large activation energy barrier which prevents conversion to graphite, the more stable allotrope at ordinary temperatures and pressures. In addition to its value as a precious gem, the uses of diamond include use as abrasives in polishes, and in various grinding, saving and drilling machines, as a material for microtone knives for biological and medicinal uses, as a radiation detector, as a detector for temperature measurement, heat sink, as wire drawing dye, stylus for phonographs, hardness indenters, and as optical windows in high pressure cells. Numerous approaches have been utilized in attempts to synthesize diamond for the above applications. The processes for synthesizing diamond results in the production of sub-diamond particles (usually made by depositing the diamond onto diamond seed crystals) or large diamond masses grown by deposition and/or compaction of diamond particles. Due to these end uses and methods of making synthetic diamond, there has been no requirement for thin diamond films or for a process for making them.

The present invention is directed to solving the disadvantages of materials heretofore utilized as X-ray transmissive elements in devices in which X-ray radiation is generated, measured, transmitted or detected, such as energy-dispersive X-ray spectrometers (EDAX) and X-ray fluorescence spectrometers (XRF). The X-ray transmissive elements of these devices include the tube within which the X-rays are produced, windows through which the X-rays must enter or exit a sample-containing chamber, and the X-ray radiation detector. The two most prevalent X-ray transmissive window materials used are beryllium and specialized polymers, however both have various disadvantages. Beryllium is toxic and is difficult to form into shapes. It is also expensive, is corrosive to moisture (even at moisture concentrations as low as atmospheric moisture) and is subject to leakage (by helium, for example) when it is formed into a thin film. Helium and other inert gases are often used as carrier media within the sample chambers under a vacuum. In addition beryllium windows of practical thicknesses (5-8 mm) are opaque to X-rays emitted by light elements such as oxygen, nitrogen, carbon and boron, so such elements cannot be detected through a beryllium window.

Polymeric materials are usually fragile and are unstable in high temperature environments of those processes which are frequently used to fabricate and operate X-ray tubes and X-ray spectrometers. Polymeric materials are also difficult to clean with organic solvents following prolonged operational use.

It is therefore an object of the present invention to provide synthetic diamond films for use as X-ray transmissive elements.

It is yet another object of the present invention to provide a method for making X-ray transmissive films of synthetic diamond. It is yet another object to provide a method for fabricating X-ray transmissive diamond windows for X-ray instruments.

These and other objects of the present invention will be apparent to those skilled in the art from the following description of the preferred embodiments and from the appended claims.

BRIEF DESCRIPTION OF THE DRAWING

In the accompanying FIGURE there is shown schematically the steps of a process for making a diamond window according to the present invention.

SUMMARY OF THE INVENTION

The present invention provides for X-ray transmissive elements comprising synthetic diamond films. These films are particularly useful in a device, such as a spectrometer for examining a sample material with X-ray radiation, wherein the device comprises an X-ray generating apparatus, a chamber for containing the sample material and a detector for detecting the X-rays.

The present invention also provides methods for forming X-ray transmissive synthetic diamond elements. In one method the synthetic diamond is deposited as a film upon a surface of a substrate to a preselected thickness, then the opposite surface of the substrate is masked at selected areas and the unmasked areas are removed by etching to expose the diamond film. In another embodiment, after depositing a diamond film upon a substrate, the entire substrate is removed by etching. In yet a third embodiment, the diamond film is deposited in a thickness greater then required, then after some or all of the substrate is removed by etching, the diamond film is separately etched to reduce its thickness to the desired thickness.

DETAILED DESCRIPTION OF THE PREFERRED EMBODIMENTS

The synthetic diamond elements according to the present invention will be formed as films upon a substrate. The substrate may be any suitable material which will withstand the conditions of diamond deposition and which are etchible by, for example, chemical etching agents. Such substrates include silicon, molybdenum and quartz. Suitable diamond deposition processes include, but are not limited to, the methods generically referred to as plasma - assisted chemical vapor deposition (CVD) and include RF plasma assisted CVD, microwave plasma CVD, direct current plasma CVD, ECR microwave plasma-assisted CVD, and UV-assisted CVD. Also methods known in the art of liquid-phase epitaxial crystal growth of diamond may be utilized. The synthetic diamond deposited onto the substrate will conform to the shape of the substrate, so the substrate, may be formed into the desired shape. The diamond films will usually be planar, but then may also be contoured if required by particular application of the window.

The preferred conditions for diamond deposition unto the substrate are under D.C. plasma-assisted deposition conditions at 0.5 to 1.5 amp. plasma current, at a temperature of 600°–800° C. using methane/hydrogen (0.8–1 : 99.5–1 volume ratio) at a total pressure of 20–30 Torr.

The deposition of these synthetic diamond films will be for the period to achieve a preselected desired thickness. Depending upon the intended end use of the window (i.e., as an X-ray tube or as window for an X-ray detector, etc.), the thickness will generally range in from 0.2 to about 50 microns. Alternatively, the film may be deposited in a thickness greater then that which is required, then etched to the desired thickness.

Subsequent to the deposition of the diamond onto the substrate, some or all of the substrate may be removed by an appropriate etching method to completely expose both surfaces of the diamond film. If desired, a portion of the substrate may be masked by a masking agent impervious to the etching agent, so that preselected portions of the substrate remain after etching. For example, the exterior edges of the substrate may be masked so that the central portion of the substrate is removed by etching, leaving an exterior support which may be used to mount the diamond film into the desired apparatus. Alternatively, the entire substrate may be removed by etching, leaving a diamond film, which may be separately mounted on an appropriate supporting structure such as a metal, ceramic or silicon grid.

The thickness of the diamond film may be reduced, if desired, by an appropriate diamond etching process, such as a plasma-assisted etching process or a thermal-oxidation process.

The diamond films according to the present invention are particularly useful as X-ray transmissive elements in X-ray spectrometers. In a typical X-ray device there is a source of X-ray radiation, a sample area which in many instances is under a vacuum, and an X-ray detector. The X-ray windows which are transmissive elements according to the present invention are particularly useful as windows between the X-ray source and the sample and between the sample and the X-ray detector. Such elements include the X-ray tube itself, and any window necessary for transmission of the X-rays to and from the sample being studied, and the X-ray detector.

Some advantages of the thin film diamond windows according to the present invention are that they are not only chemically inert and physically strong, even at thicknesses of less than 0.5 micron, but that they exhibit no X-ray fluorescence which might otherwise interfere with the X-ray analysis, they are particularly impervious to gas diffusion and leakage, such as by air or inert gases (such as helium, which is typically used in X-ray spectrometers). Furthermore, because diamond windows may be extremely thin, low-energy X-rays (such as, from C, O, B or N) can be detected. Detection of low-energy X-rays is not possible with conventional beryllium windows, because of the necessary thickness of the windows. Furthermore, because of the strength of diamond windows, large pressure differentials (in the range of 1–2 atmospheres) across the window is possible, which is advantageous in instruments which operate under low internal pressure. Moreover, windows can be weakened by repeated pressurization and depressurization upon loading the unloading samples in a low-vacuum instrument. Diamond windows may, however, withstand about 15,000 or more pressure cycles without breaking, whereas conventional polymer windows would fail under such treatment. Diamond is noncorrosive, whereas conventional beryllium films are corrosive. Furthermore, hydrocarbon or other residue build-up on the diamond window after extensive use can be removed with conventional solvents (e.g., acetone, chloroform, benzene, etc.). Polymeric films used in the art can be etched or weakened by many organic solvents. Diamond films according to the present invention will typically tolerate temperatures in excess of 150° C. in air or in excess of 1500° C. in a vacuum.

Referring to the accompanying figure, 10 is diamond film made under the conditions described above in a typical D.C. biased diamond deposition chamber, deposited on a silicon wafer substrate 11. The diamond film 10 is preferably about 0.5 micron or less in thickness. The silicon substrate 11 is then etched away by conventional procedures using a conventional etching agent such as HF and nitric acid in a 1:3 volume ratio. The diamond film 10 is then mounted onto a typical support grid 12 made of, for example a metal (such as aluminum) or silicon. The support grid 12 will preferably support primarily the edges of the film 10, with thinner inner support members provided towards the central portion of the film so as not to substantially block the passage of radiation through the film. The support grid 12 need not be adhesively contacted with the film 10. Finally, the assembly comprising the support grid 12 and film 10 will be mounted into a mount 13 to which the assembly is affixed by use of an adhesive 14 such as an epoxy. The mount 13 will in the usual case be made of metal. In a preferred embodiment the support grid 12 may be fabricated from a single crystal silicon wafer, made by known methods, into which the grid pattern is etched by known anisotropic etching techniques. Alternatively the grid may be formed from aluminum, quartz, or X-ray impervious plastics.

Having described the above preferred embodiments, it will be apparent to those skilled in the art that various modifications and alterations may be made without departing from the spirit and scope of the invention, which modifications and alterations are intended to be within the scope of the present invention. The present invention is not deemed to be limited by the foregoing description and is defined by the following claims.

What is claimed is:

1. In a device in which X-ray radiation is generated, transmitted, measured or detected, the improvement comprising, an X-ray transmissive window comprising a synthetic diamond film.

2. A method for forming an X-ray transmissive synthetic diamond window comprising the steps of:
   depositing a diamond film upon a surface of a substrate for a period of time sufficient to obtain a film of preselected thickness;
   masking selected areas on the opposite surface of said substrate with masking material resistant to chemical attack by a selected substrate-etching agent;
   applying said substrate-etching agent to said opposite surface to remove said substrate in unmasked areas, thereby exposing said diamond film in said unmasked areas.

3. A method for forming an X-ray transmissive synthetic diamond element comprising the steps of
   depositing a diamond film upon a surface of a substrate for a period of time sufficient to obtain a film of preselected thickness;
   removing said substrate with a substrate-etching agent, thereby completely exposing said diamond film.

4. A method according to claim 2 or 3 further comprising the step of etching said diamond film for a period of time sufficient to reduce the thickness thereof.

5. A method according to claim 4 wherein the thickness of said film is uniformly reduced by etching.

6. A method according to claim 4 wherein the thickness of said film is reduced in selected areas.

7. A method according to claim 2 wherein said diamond film is deposited by chemical vapor deposition.

8. A method according to claim 7 wherein said chemical vapor deposition is radio frequency plasma-assisted.

9. A method according to claim 7 wherein said chemical vapor deposition is microwave-plasma assisted.

10. A method according to claim 7 wherein said chemical vapor deposition is direct current plasma assisted.

11. A method according to claim 7 wherein said chemical vapor deposition is ultra violet-plasma assisted.

12. A method according to claim 9 wherein said microwave plasma comprises ECR-microwave generated plasma.

13. A device according to claim 1 wherein said synthetic diamond film is supported by a grid comprising quartz.

14. A method according to claim 2 wherein said substrate comprises silicon, molybdenum or quartz.

15. A device according to claim 1 wherein said synthetic diamond film is supported by a grid comprising X-ray impervious plastic.

16. A method according to claim 2 wherein said substrate is contoured.

17. A method according to claim 4 wherein said step of etching said film s plasma assisted.

18. A method according to claim 4 wherein said step of etching said film is by thermal-assisted oxidation.

19. A device according to claim 1 wherein said synthetic diamond film is supported on a metal grid.

20. A device according to claim 19 wherein said metal comprises aluminum.

21. A device according to claim 1 wherein said synthetic diamond film is supported by a silicon grid.

22. A device according to claim 21 in which said silicon grid comprises a single silicon crystal.

* * * * *